United States Patent
Kimura

(10) Patent No.: US 12,319,608 B2
(45) Date of Patent: *Jun. 3, 2025

(54) GLASS FIBERS

(71) Applicant: Nippon Electric Glass Co., Ltd., Shiga (JP)

(72) Inventor: Miki Kimura, Shiga (JP)

(73) Assignee: NIPPON ELECTRIC GLASS CO., LTD., Shiga (JP)

(*) Notice: Subject to any disclaimer, the term of this patent is extended or adjusted under 35 U.S.C. 154(b) by 0 days.

This patent is subject to a terminal disclaimer.

(21) Appl. No.: 18/730,632

(22) PCT Filed: Mar. 13, 2023

(86) PCT No.: PCT/JP2023/009522
§ 371 (c)(1),
(2) Date: Jul. 19, 2024

(87) PCT Pub. No.: WO2023/176749
PCT Pub. Date: Sep. 21, 2023

(65) Prior Publication Data
US 2024/0417309 A1   Dec. 19, 2024

(30) Foreign Application Priority Data

Mar. 16, 2022 (JP) ................. 2022-040940
Jun. 10, 2022 (JP) ................. 2022-094481
Mar. 9, 2023 (JP) ................. 2023-036411

(51) Int. Cl.
C03C 13/00 (2006.01)
C03C 3/087 (2006.01)
C03C 3/093 (2006.01)

(52) U.S. Cl.
CPC .............. *C03C 13/00* (2013.01); *C03C 3/087* (2013.01); *C03C 3/093* (2013.01)

(58) Field of Classification Search
CPC ................................ C03C 13/00; C03C 3/091
See application file for complete search history.

(56) References Cited

U.S. PATENT DOCUMENTS

| | | | |
|---|---|---|---|
| 4,762,809 A | 8/1988 | Imai | |
| 2007/0054796 A1 | 3/2007 | Shelestak et al. | |
| 2014/0364554 A1* | 12/2014 | Nonaka | C08J 5/043 524/433 |
| 2018/0127305 A1 | 5/2018 | Li | |
| 2021/0139368 A1 | 5/2021 | Nakamura et al. | |
| 2021/0206687 A1 | 7/2021 | Hsu et al. | |
| 2022/0055942 A1 | 2/2022 | Tanaka | |
| 2022/0212980 A1 | 7/2022 | Yokota | |
| 2023/0150866 A1 | 5/2023 | Cao et al. | |
| 2023/0278923 A1 | 9/2023 | Segawa et al. | |

FOREIGN PATENT DOCUMENTS

| | | |
|---|---|---|
| CN | 112573821 | 3/2021 |
| EP | 1 086 930 | 3/2001 |
| JP | 63-2831 | 1/1988 |
| JP | 3-215329 | 9/1991 |
| JP | 10-167759 | 6/1998 |
| JP | 11-292567 | 10/1999 |
| JP | 2003-137590 | 5/2003 |
| JP | 2005-8439 | 1/2005 |
| JP | 2009-507753 | 2/2009 |
| JP | 2010-248046 | 11/2010 |
| JP | 2011-68549 | 4/2011 |
| JP | 2018-518440 | 7/2018 |
| JP | 2019-112246 | 7/2019 |
| JP | 2019-119615 | 7/2019 |
| JP | 2020-93959 | 6/2020 |
| JP | 2020-186138 | 11/2020 |
| JP | 2021-109821 | 8/2021 |
| JP | 2022-503330 | 1/2022 |
| WO | 2019/198258 | 10/2019 |
| WO | WO-2020256142 A1 * | 12/2020 ............. C03B 37/02 |
| WO | 2021/256217 | 12/2021 |

OTHER PUBLICATIONS

International Search Report issued May 23, 2023 in International Application No. PCT/JP2023/009522.
Notice of Reasons for Refusal issued Jul. 13, 2022 in Japanese Application No. 2022-094477, with English translation.
Notice of Reasons for Refusal issued Nov. 16, 2022 in Japanese Application No. 2022-094477, with English translation.
Notice of Reasons for Refusal issued Apr. 19, 2023 in Japanese Application No. 2023-002800, with English translation.
Notice of Reasons for Refusal issued Jul. 26, 2023 in Japanese Application No. 2023-002800, with English translation.
Notice of Reasons for Refusal issued Sep. 13, 2023 in Japanese Application No. 2023-002800, with English translation.
Notice of Reasons for Refusal issued May 17, 2023 in Japanese Application No. 2023-036411, with English translation.
Notice of Reasons for Refusal issued Jan. 10, 2024 in Japanese Application No. 2023-145067, with English translation.
Notice of Reasons for Refusal issued Jan. 10, 2024 in Japanese Application No. 2023-145068, with English translation.
International Preliminary Report on Patentability and Written Opinion of the International Searching Authority issued Sep. 10, 2024 in International (PCT) Application No. PCT/JP2023/009522.
Office Action issued Sep. 26, 2024 in corresponding Chinese Patent Application No. 202380015530.0, with English machine translation.

* cited by examiner

*Primary Examiner* — Elizabeth A. Bolden
(74) *Attorney, Agent, or Firm* — Wenderoth, Lind & Ponack, L.L.P.

(57) ABSTRACT

Provided is a glass fiber, which achieves both of a low spinning temperature, and a low dielectric constant and a low dielectric loss tangent. The glass fiber includes as a glass composition, in terms of mass %, 40% to 80% of $SiO_2$, 0% to 20% of $Al_2O_3$, and 10% to 30% of $B_2O_3$, includes at least one kind selected from MgO, CaO, SrO, BaO, $Li_2O$, $Na_2O$, $K_2O$, $ZrO_2$, $Fe_2O_3$, $SnO_2$, F, and Cl, has a total content of $MoO_3$, $Cr_2O_3$, Pt, and Rh of from 0.01 ppm to 500 ppm, and has a value of $TiO_2$ (mass %)×$MoO_3$ (ppm) of 3,100 or less.

5 Claims, No Drawings

GLASS FIBERS

TECHNICAL FIELD

The present invention relates to a glass fiber suitable as a reinforcing material for a resin member for which low dielectric constant and low dielectric loss tangent characteristics are required, such as a component for a high-speed communication device, or an automobile radar.

BACKGROUND ART

Along with development of various electronic devices that support information industries, technologies related to a cellular phone, a personal digital assistant, and the like have dramatically progressed. For a circuit board for an electronic device, which is increasingly densified and increased in processing speed, low dielectric constant and low dielectric loss tangent characteristics are required so that delay in signal propagation due to a dielectric loss, and by extension due to a transfer loss, a conduction loss, a deformation loss, a vibration loss, or the like associated therewith is minimized, and heat generation of the board due to a heat loss is prevented. Examples of such circuit board for an electronic device include a printed wiring board and a low-temperature fired board. The printed wiring board is a composite material obtained by mixing glass fibers as a reinforcing material in a resin, and forming the mixture into a sheet shape. The low-temperature fired board is obtained by firing a green sheet of composite powder obtained by mixing a filler such as silica in powder glass containing $SiO_2$ and $B_2O_3$ in large amounts (see, for example, Patent Literature 1).

In addition, other than the foregoing, along with downsizing of the electronic devices and increases in their communication speeds, in recent years, it has been increasingly required that a peripheral resin member of a circuit board, or a resin member to be used in a component for a communication device or an electronic device casing achieve reductions in dielectric characteristics, and it has been required that also glass fibers to be used as a reinforcing material for the resin member achieve reductions in dielectric constant and dielectric loss tangent. Further, also in automobile industries, along with development of an autonomous driving system, there is expected an increasing demand for a glass fiber-reinforced resin having high strength and light weight, and also having low dielectric constant and low dielectric loss tangent characteristics as a member to be used in an automobile radar or a camera.

CITATION LIST

Patent Literature 1: JP 63-2831 A

SUMMARY OF INVENTION

Technical Problem

As a glass fiber for reinforcing the printed wiring board and the resin, E glass (having a dielectric constant ε of 6.9 and a dielectric loss tangent tan δ of $46\times10^{-4}$ at room temperature (25° C.) and at a frequency of 2.45 MHZ) is generally known. However, there has been a problem in that the E glass does not satisfy the above-mentioned requirements for reductions in dielectric constant and dielectric loss tangent. Accordingly, in Patent Literature 1, there is disclosed glass called D glass characterized by having a dielectric constant and a dielectric loss tangent lower than those of the E glass. For example, the D glass has a dielectric constant ε of 4.2 and a dielectric loss tangent tan δ of $15\times10^{-4}$ at room temperature and at a frequency of 2.45 GHZ.

Incidentally, the automobile radar, the electronic device casing, or the like is often used outdoors, and is hence subjected to a severe environment, such as UV light in solar light, or changes in weather and temperature. In particular, the UV light causes significant deterioration of a resin, and has a large influence on the lifetime of a material.

In view of the above-mentioned circumstances, an object of the present invention is to provide a glass fiber, which, while suppressing deterioration of a resin caused by UV light, is suppressed in coloring and thus hardly changes the color tone of a composite material, and which has low dielectric constant and low dielectric loss tangent characteristics.

Solution to Problem

According to one aspect of the present invention, there is provided a glass fiber, comprising as a glass composition, in terms of mass %, 40% to 80% of $SiO_2$, 0% to 20% of $Al_2O_3$, and 10% to 30% of $B_2O_3$, comprising at least one kind selected from MgO, CaO, SrO, BaO, $Li_2O$, $Na_2O$, $K_2O$, $ZrO_2$, $Fe_2O_3$, $SnO_2$, F, and Cl, having a total content of $MoO_3$, $Cr_2O_3$, Pt, and Rh of from 0.01 ppm to 500 ppm, and having a value of $TiO_2$ (mass %)×$MoO_3$ (ppm) of 3,100 or less. With this configuration, when the glass fiber is composited with a resin, while deterioration of the resin caused by UV light is suppressed, the color tone of a composite material is hardly changed, and low dielectric constant and low dielectric loss tangent characteristics can be achieved. Herein, a material obtained by compositing the resin and the glass fiber is sometimes referred to simply as "composite material".

It is preferred that the glass fiber according to the one aspect of the present invention have a total light transmittance at a wavelength of 300 nm of 70% or less and a minimum total light transmittance at wavelengths of from 400 nm to 800 nm of 50% or more at a thickness of 1 mm. With this configuration, when the glass fiber is composited with a resin, the glass fiber easily absorbs UV light in solar light, and thus UV light radiated to the resin can be reduced. Accordingly, deterioration of the resin can be suppressed. In addition, the degree of coloring of the glass fiber in itself is low. Accordingly, when the glass fiber is composited with a resin, the color tone of a composite material is hardly changed.

It is preferred that the glass fiber according to the one aspect of the present invention have a dielectric constant of 6 or less and a dielectric loss tangent of 0.011 or less at 25° C. and 40 GHz. With this configuration, a transmission loss of a member obtained by compositing the glass fiber with a resin can be reduced.

It is preferred that the glass fiber according to the one aspect of the present invention have a spinning temperature of 1,450° C. or less. With this configuration, the deformation of a bushing facility is small, and its long-term operation can be achieved. In addition, the elution of a precious metal element from the bushing facility can be suppressed, and thus phase separation of glass resulting from the precious metal element is suppressed. Accordingly, a reduction in water resistance is less liable to occur. In the present invention, the "spinning temperature" means a temperature at which the viscosity of the glass becomes $10^{3.0}$ dPa·s.

According to another aspect of the present invention, there is provided a glass fiber, comprising as a glass composition, in terms of mass %, 40% to 80% of $SiO_2$, 0% to 20% of $Al_2O_3$, 10% to 30% of $B_2O_3$, 0% to 0.15% of $Fe_2O_3$, and 0.01 ppm to 100 ppm of Pt, comprising at least one kind selected from MgO, CaO, SrO, BaO, $Na_2O$, and $K_2O$, and comprising at least one kind selected from $Li_2O$, $ZrO_2$, $TiO_2$, $Fe_2O_3$, $MoO_3$, $Cr_2O_3$, $SnO_2$, F, Cl, and Rh.

According to still another aspect of the present invention, there is provided a glass fiber, comprising as a glass composition, in terms of mass %, 55% to 80% of $SiO_2$, 0% to 15% of $Al_2O_3$, and 10% to 30% of $B_2O_3$, comprising at least one kind selected from MgO, CaO, SrO, BaO, $Li_2O$, $Na_2O$, $K_2O$, $Fe_2O_3$, $SnO_2$, F, and Cl, having a total content of $MoO_3$, $Cr_2O_3$, Pt, and Rh of from 0.01 ppm to 500 ppm, and having a value of $TiO_2$ (mass %)×$MoO_3$ (ppm) of 3,100 or less.

Advantageous Effects of Invention

According to the present invention, the glass fiber, which, while suppressing deterioration of the resin caused by UV light, is suppressed in coloring and thus hardly changes the color tone of the composite material, and which has low dielectric constant and low dielectric loss tangent characteristics, can be provided.

DESCRIPTION OF EMBODIMENTS

A glass fiber of the present invention comprises as a glass composition, in terms of mass %, 40% to 80% of $SiO_2$, 0% to 20% of $Al_2O_3$, and 10% to 30% of $B_2O_3$, comprises at least one kind selected from MgO, CaO, SrO, BaO, $Li_2O$, $Na_2O$, $K_2O$, $ZrO_2$, $Fe_2O_3$, $SnO_2$, F, and Cl, has a total content of $MoO_3$, $Cr_2O_3$, Pt, and Rh of from 0.01 ppm to 500 ppm, and has a value of $TiO_2$ (mass %)×$MoO_3$ (ppm) of 3, 100 or less. The reasons why the glass composition is limited as described above are described in detail below. In the present invention, the expression "%" refers to "mass %" unless otherwise specified.

$SiO_2$ is a component that forms a skeleton of a network structure in a glass structure, and is also a component that reduces a dielectric constant and a dielectric loss tangent. When the content of $SiO_2$ is too small, it is difficult to obtain the above-mentioned effects. Meanwhile, when the content of $SiO_2$ is too large, the solubility of raw materials is reduced, and it becomes difficult to obtain homogeneous glass. In addition, a spinning temperature is increased, which results in a reduction in productivity. Accordingly, a suitable lower limit range of the content of $SiO_2$ is 40% or more, 45% or more, 50% or more, 54% or more, 55% or more, 60% or more, 64% or more, 65% or more, 67% or more, or 70% or more, most preferably 73% or more, and a suitable upper limit range thereof is 80% or less, less than 80%, 79% or less, or 78% or less, most preferably 76% or less.

$Al_2O_3$ is a component that forms the skeleton of the glass, and suppresses phase separation of the glass to stabilize the glass. However, when the content of $Al_2O_3$ is too large, the dielectric constant and the dielectric loss tangent are liable to be increased. Accordingly, a suitable upper limit range is 20% or less, 19% or less, 18% or less, 17% or less, 16% or less, 15% or less, 13% or less, 10% or less, less than 10%, 8% or less, 5% or less, 3% or less, 2% or less, 1% or less, less than 1%, 0.9% or less, 0.8% or less, less than 0.5%, less than 0.4%, less than 0.2%, or 0.1% or less, particularly less than 0.1%. A lower limit range of the content of $Al_2O_3$ is not particularly limited, and is 0% or more, but in order to obtain the above-mentioned effects, is preferably 0.01% or more, particularly preferably 0.015% or more.

As with $SiO_2$, $B_2O_3$ is a component that forms the skeleton of the glass, and is also a component that reduces the dielectric constant and the dielectric loss tangent. When the content of $B_2O_3$ is too small, it is difficult to obtain the above-mentioned effects. Meanwhile, when the content of $B_2O_3$ is too large, the glass is liable to undergo phase separation, which may result in a reduction in productivity. Accordingly, a suitable lower limit range of the content of $B_2O_3$ is 10% or more, 12% or more, 13% or more, 15% or more, 16% or more, or 17% or more, particularly 18% or more, and a suitable upper limit range thereof is 30% or less, 28% or less, 26% or less, 25% or less, or 24% or less, particularly 23% or less.

MgO is a component that reduces the viscosity of the glass, and is also a component that is less liable to increase the dielectric constant and the dielectric loss tangent than alkali metal components, such as $Li_2O$, $Na_2O$, and $K_2O$. MgO has a suppressing effect on a dielectric loss caused by transfer of an alkali metal ion when MgO coexists with an alkali metal element. However, when the content of MgO is too large, the phase separation may be promoted. This tendency is remarkable particularly in a glass composition system in which the content of $Al_2O_3$ is small. Accordingly, a suitable upper limit range of the content of MgO is 8% or less, 7% or less, 6% or less, 5% or less, 4% or less, 3% or less, 2% or less, or 1.5% or less, particularly 1% or less. A lower limit range of the content of MgO is not particularly limited, and is 0% or more, but in order to obtain the above-mentioned effects, is preferably 0.01% or more, 0.05% or more, or 0.07% or more, particularly preferably 0.1% or more.

As with MgO, CaO is a component that reduces the viscosity of the glass, and is also a component that is less liable to increase the dielectric constant and the dielectric loss tangent than the alkali metal components, such as $Li_2O$, $Na_2O$, and $K_2O$. CaO has a suppressing effect on the transfer of an alkali metal ion when CaO coexists with an alkali metal element. However, when the content of CaO is too large, the phase separation may be promoted. This tendency is remarkable particularly in a glass composition system in which the content of $Al_2O_3$ is small. Accordingly, a suitable upper limit range of the content of CaO is 8% or less, 7% or less, 6% or less, 5% or less, 4% or less, 3% or less, 2% or less, or 1.5% or less, particularly 1% or less. A lower limit range of the content of CaO is not particularly limited, and is 0% or more, but in order to obtain the above-mentioned effects, is preferably 0.01% or more, 0.05% or more, or 0.07% or more, particularly preferably 0.1% or more.

As with MgO and CaO, SrO is a component that reduces the viscosity of the glass, and is also a component that is less liable to increase the dielectric constant and the dielectric loss tangent than the alkali metal components, such as $Li_2O$, $Na_2O$, and $K_2O$. SrO has a suppressing effect on the transfer of an alkali metal ion when SrO coexists with an alkali metal element. However, when the content of SrO is too large, the phase separation may be promoted. This tendency is remarkable particularly in a glass composition system in which the content of $Al_2O_3$ is small. Accordingly, a suitable upper limit range of the content of SrO is 8% or less, 7% or less, 6% or less, 5% or less, 4% or less, 3% or less, 2% or less, or 1.5% or less, particularly 1% or less. From the viewpoint of suppressing the phase separation, the content of SrO may be 0%. A lower limit range of the content of SrO is not particularly limited, and is 0% or more, but in order to obtain the above-mentioned effects, is preferably 0.01% or more, 0.05% or more, or 0.07% or more, particularly preferably 0.1% or more.

As with MgO and CaO, BaO is a component that reduces the viscosity of the glass, and is also a component that is less liable to increase the dielectric constant and the dielectric loss tangent than the alkali metal components, such as $Li_2O$, $Na_2O$, and $K_2O$. BaO has a suppressing effect on the transfer of an alkali metal ion when BaO coexists with an alkali metal element. However, when the content of BaO is too large, the phase separation may be promoted. This tendency is remarkable particularly in a glass composition system in which the content of $Al_2O_3$ is small. Accordingly, a suitable upper limit range of the content of BaO is 8% or less, 7% or less, 6% or less, 5% or less, 4% or less, 3% or less, 2% or less, or 1.5% or less, particularly 1% or less. From the viewpoint of suppressing the phase separation, the content of BaO may be 0%. A lower limit range of the content of BaO is not particularly limited, and is 0% or more, but in order to obtain the above-mentioned effects, is preferably 0.01% or more, 0.05% or more, or 0.07% or more, particularly preferably 0.1% or more.

$Li_2O$ is a component that reduces the viscosity of the glass and thus reduces the spinning temperature, to thereby be able to reduce a production cost, but when the content thereof is too large, the dielectric constant and the dielectric loss tangent are liable to be increased. In addition, when a composite material of the glass fiber and a resin is subjected to an environment at high temperature and high humidity, $Li_2O$ elutes from the glass, and hence a reduction in adhesiveness between the glass fiber and the resin and a reduction in fiber diameter caused by erosion of the glass fiber are liable to occur. As a result, the mechanical strength of the composite material is liable to be reduced. Accordingly, a suitable upper limit range is 2% or less, 1.5% or less, or 1.4% or less, particularly 1.3% or less. Meanwhile, a lower limit range of the content of $Li_2O$ is not particularly limited, and is 0% or more, but in order to obtain the above-mentioned effects, is preferably 0.001% or more, 0.005% or more, 0.01% or more, 0.02% or more, 0.05% or more, 0.08% or more, or 0.1% or more, particularly preferably 0.15% or more.

As with $Li_2O$, $Na_2O$ is a component that reduces the viscosity of the glass and thus reduces the spinning temperature, to thereby be able to reduce the production cost, but when the content thereof is too large, the dielectric constant and the dielectric loss tangent are liable to be increased. In addition, when a composite material of the glass fiber and a resin is subjected to an environment at high temperature and high humidity, $Na_2O$ elutes from the glass, and hence a reduction in adhesiveness between the glass fiber and the resin and a reduction in fiber diameter caused by erosion of the glass fiber are liable to occur. As a result, the mechanical strength of the composite material is liable to be reduced. Accordingly, a suitable upper limit range is 3% or less or 2.4% or less, particularly 2.3% or less. Meanwhile, a lower limit range of the content of $Na_2O$ is not particularly limited, and is 0% or more, but in order to obtain the above-mentioned effects, is preferably 0.01% or more, 0.05% or more, 0.08% or more, 0.1% or more, 0.5% or more, or 0.8% or more, particularly preferably 1% or more.

As with $Li_2O$ and $Na_2O$, $K_2O$ is a component that reduces the viscosity of the glass and thus reduces the spinning temperature, to thereby be able to reduce the production cost, but when the content thereof is too large, the dielectric constant and the dielectric loss tangent are liable to be increased. In addition, when a composite material of the glass fiber and a resin is subjected to an environment at high temperature and high humidity, $K_2O$ elutes from the glass, and hence a reduction in adhesiveness between the glass fiber and the resin and a reduction in fiber diameter caused by erosion of the glass fiber are liable to occur. As a result, the mechanical strength of the composite material is liable to be reduced. Accordingly, a suitable upper limit range is 3% or less, 2.4% or less, or 2.3% or less, particularly 2% or less. Meanwhile, a lower limit range of the content of $K_2O$ is not particularly limited, and is 0% or more, but in order to obtain the above-mentioned effects, is preferably 0.01% or more, 0.05% or more, 0.08% or more, 0.1% or more, 0.5% or more, or 0.8% or more, particularly preferably 1% or more.

When $Li_2O+Na_2O+K_2O$ (total content of $Li_2O$, $Na_2O$, and $K_2O$) is too large, the dielectric constant and the dielectric loss tangent are liable to be increased. In addition, when a composite material of the glass fiber and a resin is subjected to an environment at high temperature and high humidity, $Li_2O$, $Na_2O$, and/or $K_2O$ elutes from the glass, and hence a reduction in adhesiveness between the glass fiber and the resin and a reduction in fiber diameter caused by erosion of the glass fiber are liable to occur. As a result, the mechanical strength of the composite material is liable to be reduced. Accordingly, a suitable upper limit range is 7.5% or less, 7.4% or less, or 7% or less, particularly 6.5% or less. Meanwhile, a lower limit range of $Li_2O+Na_2O+K_2O$ is not particularly limited, and is 0% or more, but in order to obtain the above-mentioned effects, is preferably 0.1% or more, 0.3% or more, or 0.5% or more, particularly preferably 1% or more. $Li_2O$, $Na_2O$, and $K_2O$ are each a component that is liable to elute from the glass, but their elution can also be suppressed by causing these components to coexist with each other to inhibit their transfer in the glass. Accordingly, it is preferred that two kinds or three kinds of those components be mixed and incorporated in the glass.

$ZrO_2$ is a component that improves the chemical durability of the glass. However, when the content of $ZrO_2$ is too large, a liquidus temperature is increased, and devitrification occurs at the time of spinning, which may result in a reduction in production efficiency. Accordingly, a suitable upper limit range is 1.5% or less, 1.3% or less, 1.2% or less, 1% or less, 0.5% or less, or 0.2% or less, particularly less than 0.2%. When the content of $ZrO_2$ is too small, it is difficult to obtain the above-mentioned effects. Meanwhile, a lower limit range of the content of $ZrO_2$ is not particularly limited, and is 0% or more, but in order to obtain the above-mentioned effects, is preferably 0.001% or more, 0.005% or more, 0.01% or more, 0.05% or more, or 0.08% or more, particularly preferably 0.1% or more.

$Fe_2O_3$ is a component that has a fining action. In addition, $Fe_2O_3$ is a component that can absorb UV light to suppress deterioration of a resin. However, when the content of $Fe_2O_3$ is too large, the dielectric constant and the dielectric loss tangent may be increased. In addition, absorption occurs not only in the ultraviolet region but also in the visible region, and the color tone of a composite material may be changed through coloring of the glass. Accordingly, a suitable upper limit range is 0.5% or less, 0.4% or less, 0.3% or less, less than 0.2%, 0.15% or less, 0.1% or less, or 0.09% or less, particularly 0.08% or less. Meanwhile, a lower limit range of the content of $Fe_2O_3$ is not particularly limited, and is 0% or more, but in order to obtain the above-mentioned effects, is preferably 0.0001% or more, 0.0005% or more, 0.001% or more, or 0.005% or more, particularly preferably 0.01% or more.

Also $SnO_2$ is a component that has a fining action. Specifically, $SnO_2$ releases an oxygen gas at 1,500° C. or more through a change in valence of Sn in accordance with the temperature of molten glass. In addition, $SnO_2$ is a component that can absorb UV light to suppress deterioration of a resin. However, when the content thereof is large, absorption of light in the visible region is increased, and the glass may be colored. Accordingly, a suitable upper limit range is 0.5% or less, 0.45% or less, 0.4% or less, or 0.35% or less, particularly 0.3% or less. From the viewpoint of suppressing the coloring of the glass, the content of $SnO_2$ may be 0%. Meanwhile, a lower limit range of the content of $SnO_2$ is not particularly limited, and is 0% or more, but in order to obtain the above-mentioned effects, a lower limit range thereof suitable for obtaining a sufficient fining effect is preferably 0% or more, 0.01% or more, 0.02% or more, or 0.05% or more. When the contents of the alkali metal components, such as $Li_2O$, $Na_2O$, and $K_2O$, are small, a melting temperature is liable to be increased. $SO_3$, which similarly has a fining action, is decomposed at 1,400° C. or more to release a $SO_2$ gas. When the gas is released under the state in which the viscosity of the molten glass is high, sufficient bubble breaking cannot be expected. In such case, the use of $SnO_2$ as a fining agent is preferred.

Also F is a component that has a fining action. In addition, F has a reducing effect on the viscosity of the molten glass. However, when the content thereof is large, an environmental load may be increased, or a melting facility may be corroded. Accordingly, a suitable upper limit range is 0.5% or less, 0.3% or less, or 0.2% or less, particularly 0.1% or less. Meanwhile, a lower limit range of the content of F is not particularly limited, and is 0% or more, but in order to obtain the above-mentioned effects, is preferably 0.01% or more, 0.02% or more, or 0.05% or more.

Also Cl is a component that has a fining action. In addition, Cl has a reducing effect on the viscosity of the molten glass. However, when the content thereof is large, an environmental load may be increased, or a melting facility may be corroded. Accordingly, a suitable upper limit range is 0.5% or less, 0.3% or less, or 0.2% or less, particularly 0.1% or less. Meanwhile, a lower limit range of the content of Cl is not particularly limited, and is 0% or more, but in order to obtain the above-mentioned effects, is preferably 0.01% or more, 0.02% or more, or 0.05% or more.

As with $Fe_2O_3$, $MoO_3$ may be added as a UV absorber. However, when the content thereof is too large, absorption in the visible region is increased, and the glass is liable to be colored. Accordingly, a suitable upper limit range is 500 ppm or less, 300 ppm or less, 200 ppm or less, 100 ppm or less, or 50 ppm or less, particularly less than 20 ppm. Meanwhile, a lower limit range of the content of $MoO_3$ is not particularly limited, and is 0 ppm or more, but in order to obtain the above-mentioned effects, is preferably 0.01 ppm or more or 0.02 ppm or more, particularly preferably 0.03 ppm or more.

When $MoO_3$ is used in combination with $TiO_2$, $MoO_3$ is liable to be reduced. The glass may be colored owing to the foregoing. Accordingly, a value of the content (mass %) of $TiO_2$×the content (ppm) of $MoO_3$ is preferably 3,100 or less, 3,000 or less, 2,900 or less, 2,800 or less, 2,500 or less, 2,000 or less, 1, 500 or less, 1,000 or less, 500 or less, 100 or less, 50 or less, or 20 or less, particularly preferably 10 or less. A lower limit thereof is not particularly limited, and may be 0 or 0 or more, but is preferably 0.01 or more or 0.1 or more, particularly preferably 1 or more.

$TiO_2$ is a component that reduces the viscosity of the glass, and easily absorbs UV light. In addition, there are tendencies that the dielectric constant is liable to be increased, but the dielectric loss tangent is hardly changed. When the content of $TiO_2$ is too large, the liquidus temperature is increased, and devitrification occurs at the time of spinning, which may result in a reduction in production efficiency. In addition, absorption in the visible region is increased, and the glass is liable to be colored. Accordingly, a suitable upper limit range is 7% or less, 6.5% or less, 6% or less, 5.5% or less, 4% or less, 3% or less, 2% or less, 1% or less, 0.5% or less, or 0.2% or less, particularly less than 0.2%. Meanwhile, a lower limit range of the content of $TiO_2$ is not particularly limited, but in order to obtain the above-mentioned effects, $TiO_2$ may be incorporated in the glass in a predetermined amount. In addition, $TiO_2$ is often incorporated in the glass as an impurity of a natural raw material. The use of a high-purity raw material leads to an increase in production cost, and hence also from the viewpoint of reducing the production cost, $TiO_2$ may be incorporated in the glass in a predetermined amount. As described above, a lower limit range of the content of $TiO_2$ may be 0% or more, 0.01% or more, 0.05% or more, or 0.1% or more, particularly 0.2% or more.

As with $Fe_2O_3$ and $MoO_3$, $Cr_2O_3$ may be added as a UV absorber. However, when the content thereof is too large, absorption in the visible region is increased, and the glass is liable to be colored. Accordingly, a suitable upper limit range is 500 ppm or less, 300 ppm or less, 200 ppm or less, 100 ppm or less, 50 ppm or less, 20 ppm or less, 10 ppm or less, 5 ppm or less, 1 ppm or less, or 0.5 ppm or less, particularly less than 0.2 ppm. Meanwhile, a lower limit range of the content of $Cr_2O_3$ is not particularly limited, and is 0 ppm or more, but in order to obtain the above-mentioned effects, may be 0.01 ppm or more, 0.1 ppm or more, or 0.5 ppm or more, particularly 1 ppm or more.

As with $Fe_2O_3$ and $MoO_3$, Pt may be added as a UV absorber. However, when the content thereof is too large, absorption in the visible region is increased, and the glass is liable to be colored. Accordingly, a suitable upper limit range is 100 ppm or less, 90 ppm or less, 70 ppm or less, 50 ppm or less, 30 ppm or less, 10 ppm or less, 5 ppm or less, 1 ppm or less, or 0.5 ppm or less, particularly less than 0.2 ppm. Meanwhile, a lower limit range of the content of Pt is not particularly limited, and is 0 ppm or more, but in order to obtain the above-mentioned effects, is preferably 0.01 ppm or more or 0.02 ppm or more, particularly preferably 0.03 ppm or more.

As with $Fe_2O_3$ and $MoO_3$, Rh may be added as a UV absorber. However, when the content thereof is too large, absorption in the visible region is increased, and the glass is liable to be colored. Accordingly, a suitable upper limit range is 100 ppm or less, 90 ppm or less, 70 ppm or less, 50 ppm or less, 30 ppm or less, 10 ppm or less, 5 ppm or less, 1 ppm or less, or 0.5 ppm or less, particularly less than 0.2 ppm. Meanwhile, a lower limit range of the content of Rh is not particularly limited, and is 0 ppm or more, but in order to obtain the above-mentioned effects, is preferably 0.01 ppm or more or 0.02 ppm or more, particularly preferably 0.03 ppm or more.

In order to sufficiently obtain a UV absorbing ability, the total content of $MoO_3$, $Cr_2O_3$, Pt, and Rh is preferably 0.01 ppm or more or 0.02 ppm or more, particularly preferably 0.03 ppm or more. However, when the content of those components is too large, absorption in the visible region is increased, and the glass is liable to be colored. Accordingly, the total content of $MoO_3$, $Cr_2O_3$, Pt, and Rh is preferably 500 ppm or less, 300 ppm or less, 200 ppm or less, 100 ppm or less, 90 ppm or less, 70 ppm or less, 50 ppm or less, 30 ppm or less, or 25 ppm or less, particularly preferably 20 ppm or less.

Of the UV absorbers, Pt and Rh each cause less coloring of the glass and can each efficiently absorb UV light. Accordingly, when the content ratio of Pt and Rh in the UV absorbers is appropriately adjusted, a UV absorbing effect can be efficiently provided. Accordingly, a suitable lower limit range of the content ratio of Pt and Rh calculated from the expression: $\{(Pt+Rh)/(Pt+Rh+MoO_3+Cr_2O_3)\}\times100(\%)$ is 0.01% or more, 0.02% or more, 0.05% or more, or 0.1% or more. Meanwhile, a suitable upper limit range thereof is 100% or less, 99% or less, 98% or less, 80% or less, 70% or less, 60% or less, 50% or less, 40% or less, 30% or less, 20% or less, or 10% or less. The $\{(Pt+Rh)/(Pt+Rh+MoO_3+Cr_2O_3)\}\times100(\%)$ is a value obtained by multiplying a value, which is obtained by dividing the total of the contents (ppm) of Pt and Rh by the total of the contents (ppm) of Pt, Rh, $MoO_3$, and $Cr_2O_3$, by 100.

An upper limit of a value of a product of a transmittance at a wavelength of 300 nm (% T at 300 nm) and a ratio of Pt to Pt and Rh (Pt/(Pt+Rh)), ((% T at 300 nm)×(Pt/(Pt+Rh))), is preferably 50 or less or 40 or less, particularly preferably 30 or less. With this configuration, a UV absorbing effect can be efficiently provided.

The UV absorber, such as Pt, Rh, $Cr_2O_3$, $MoO_3$, $Fe_2O_3$, or $SnO_2$, may be added as a raw material in a small amount, or may be mixed in the glass from a melting facility such as a melting kiln. In the latter case, the content thereof may be controlled by adjusting the output of an electrode of the melting kiln, the electric power of a bushing, or the like.

The glass fiber of the present invention may comprise the following components in addition to the above-mentioned components.

As with MgO and CaO, ZnO is a component that reduces the viscosity of the glass, and is also a component that is less liable to increase the dielectric constant and the dielectric loss tangent than the alkali metal components, such as $Li_2O$, $Na_2O$, and $K_2O$. ZnO has a suppressing effect on the transfer of an alkali metal ion when ZnO coexists with an alkali metal element. However, when the content of ZnO is too large, the phase separation may be promoted. This tendency is remarkable particularly in a glass composition system in which the content of $Al_2O_3$ is small. Accordingly, a suitable upper limit range of the content of ZnO is 8% or less, 7% or less, 6% or less, 5% or less, 4% or less, 3% or less, 2% or less, or 1.5% or less, particularly 1% or less. From the viewpoint of suppressing the phase separation, the content of ZnO may be 0%. A lower limit range of the content of ZnO is not particularly limited, and is 0% or more, but in order to obtain the above-mentioned effects, is preferably 0.01% or more, 0.05% or more, or 0.07% or more, particularly preferably 0.1% or more.

$SO_3$ is a component that functions as a fining agent. Specifically, $SO_3$ releases a $SO_2$ gas in molten glass at 1,400° C. or more to provide a fining effect. However, when the content thereof is too large, the molten glass is liable to be reduced, which may cause unpreferred coloring through reduction of a transition metal in the molten glass. Accordingly, a suitable upper limit range is 0.1% or less, less than 0.1%, or 0.05% or less, particularly 0.03% or less. Meanwhile, a lower limit range of the content of $SO_3$ is not particularly limited, and is 0% or more, but in order to obtain the above-mentioned effects, is preferably 0.0005% or more, 0.0010% or more, 0.0050% or more, more than 0.0050%, 0.0051% or more, 0.0053% or more, or 0.0055% or more, particularly preferably 0.0057% or more.

Other than $SO_3$, $Sb_2O_3$, $As_2O_3$, $CeO_2$, or the like may be incorporated in the glass as a fining agent or in order to reduce the viscosity of the molten glass. However, when the contents of those components are too large, there are concerns about an environmental load, corrosion of a facility, and the like. Suitable upper limit ranges of the contents of those fining agents are each 0.5% or less, 0.3% or less, or 0.2% or less, particularly 0.1% or less. In consideration of the above-mentioned concerns, the contents of $Sb_2O_3$, $As_2O_3$, and $CeO_2$ may each be 0%. Meanwhile, lower limit ranges of the contents of those fining agents are not particularly limited, and are each 0% or more, but in order to obtain the above-mentioned effects, are each preferably 0.0005% or more or 0.0010% or more, particularly preferably 0.0050% or more. Those fining agents may be used alone or in combination thereof. When the fining agents are used in combination, an upper limit range of the total content thereof is preferably 0.5% or less, 0.3% or less, or 0.2% or less, particularly preferably 0.1% or less, and a lower limit range thereof is preferably 0% or more, 0.0005% or more, or 0.0010% or more, particularly preferably 0.0050% or more.

A glass fiber according to another aspect of the present invention comprises as a glass composition, in terms of mass %, 40% to 80% of $SiO_2$, 0% to 20% of $Al_2O_3$, 10% to 30% of $B_2O_3$, 0% to 0.15% of $Fe_2O_3$, and 0.01 ppm to 100 ppm of Pt, comprises at least one kind selected from MgO, CaO, SrO, BaO, $Na_2O$, and $K_2O$, and comprises at least one kind selected from $Li_2O$, $ZrO_2$, $TiO_2$, $Fe_2O_3$, $MoO_3$, $Cr_2O_3$, $SnO_2$, F, Cl, and Rh.

A glass fiber according to still another aspect of the present invention comprises as a glass composition, in terms of mass %, 55% to 80% of $SiO_2$, 0% to 15% of $Al_2O_3$, and 10% to 30% of $B_2O_3$, comprises at least one kind selected from MgO, CaO, SrO, BaO, $Li_2O$, $Na_2O$, $K_2O$, $Fe_2O_3$, $SnO_2$, F, and Cl, has a total content of $MoO_3$, $Cr_2O_3$, Pt, and Rh of from 0.01 ppm to 500 ppm, and has a value of $TiO_2$ (mass %)×$MoO_3$ (ppm) of 3,100 or less.

Preferred ranges of the contents of the respective components in the glass fibers according to another aspect and still another aspect of the present invention and reasons therefor are the same as described above, and hence the description thereof is omitted here.

Next, the characteristics of the glass fiber of the present invention are described in detail below.

In order to protect a resin in a composite material from UV light in solar light, a transmittance at a wavelength of 300 nm, at which the resin is most susceptible to deterioration, is important. Accordingly, the glass fiber of the present invention preferably has a total light transmittance at a wavelength of 300 nm of 70% or less, 69% or less, 68% or less, 67% or less, 66% or less, or 65% or less at a thickness of 1 mm.

In addition, in order to prevent the color tone of the composite material from being improperly changed, coloring of the glass fiber (transmittance in the visible region) is important. Accordingly, the glass fiber of the present invention preferably has a minimum total light transmittance at from 400 nm to 800 nm of 50% or more, 55% or more, 60% or more, 65% or more, 70% or more, 75% or more, 80% or more, 85% or more, 86% or more, 88% or more, or 90% or more at a thickness of 1 mm.

When the dielectric constant and the dielectric loss tangent are low, a dielectric loss is reduced. Accordingly, the glass fiber of the present invention has a dielectric constant at 25° C. and 40 GHz of preferably 6 or less, 5.5 or less, 5 or less, or 4.8 or less, particularly preferably 4.7 or less. A lower limit thereof is not particularly specified, but is realistically 1 or more. In addition, the glass fiber of the present invention has a dielectric loss tangent at 25° C. and 40 GHz of preferably 0.01 or less, 0.009 or less, 0.008 or less, or 0.007 or less, particularly preferably 0.006 or less. With this configuration, the glass fiber of the present invention is suitable as a glass fiber to be used in applications for which low dielectric characteristics are required, for example, a resin reinforcing material of a printed wiring board, a component for a communication device, or the like.

The spinning temperature is a temperature corresponding to a viscosity of $10^{3.0}$ dPa·s, and when the spinning temperature is high, damage to a bushing is increased, and the lifetime of the bushing is shortened. In addition, a bushing exchange frequency and energy cost are increased, which results in an increase in production cost. Accordingly, the spinning temperature of the glass fiber of the present invention is preferably 1,450° C. or less or 1,420° C. or less, particularly preferably 1,380° C. or less.

When the liquidus temperature is high, stable production becomes difficult. Accordingly, the liquidus temperature of the glass fiber of the present invention is preferably 1,350° C. or less, 1,300° C. or less, 1,250° C. or less, 1,200° C. or less, 1,150° C. or less, 1,100° C. or less, or 1,010° C. or less, particularly preferably 1,000° C. or less.

In addition, as a difference between the liquidus temperature and the spinning temperature is increased more, a crystal is less liable to flow out at the time of spinning, and breaking of a thread is less liable to occur, with the result that the productivity is improved more. Accordingly, the difference ($\Delta T$) between the liquidus temperature and the spinning temperature is preferably 50° C. or more, 60° C. or more, 70° C. or more, 90° C. or more, 100° C. or more, 110° C. or more, or 125° C. or more, particularly preferably 180° C. or more.

A density is a characteristic that affects the weight of a composite material of a resin and the glass fiber. When the density of the glass fiber is increased, the weight of the composite material is increased, and weight saving becomes difficult. Accordingly, the density of the glass fiber is preferably 2.55 g/cm$^3$ or less or 2.45 g/cm$^3$ or less, particularly preferably 2.4 g/cm$^3$ or less. A lower limit value thereof is not particularly limited, but is realistically 2 g/cm$^3$ or more.

A Young's modulus is a characteristic that affects the strength of a composite material of a resin and the glass fiber. When the Young's modulus of the glass fiber is too low, it becomes difficult to obtain a composite material having sufficient strength. Meanwhile, when the Young's modulus of the glass fiber is too high, the flexibility of the composite material is lost, and its processing becomes difficult. Accordingly, a suitable lower limit range of the Young's modulus is 40 GPa or more or 45 GPa or more, particularly 50 GPa or more, and a suitable upper limit range thereof is 90 GPa or less, particularly 85 GPa or less.

The water content in the glass affects dielectric characteristics. The water content in the glass may be evaluated by a "β-OH value". The "β-OH value" refers to a value calculated from the following formula by measuring the transmittances of the glass with a FT-IR.

$$\beta\text{-OH value} = (1/t) \times \log_{10}(T_1/T_2)$$

t: Thickness (mm) of glass
$T_1$: Transmittance (%) at a reference wavelength of 3,846 cm$^{-1}$ (2,600 nm)
$T_2$: Minimum transmittance (%) around a hydroxyl group absorption wavelength of 3,600 cm$^{-1}$ (2,800 nm)

When the β-OH value is too high, a network in the glass is broken, and non-crosslinked oxygen is liable to be increased. Accordingly, polarization locally occurs, and the dielectric constant and the dielectric loss tangent may be increased. Accordingly, a suitable upper limit range of the β-OH value is 0.9/mm or less, 0.88/mm or less, 0.85/mm or less, 0.8/mm or less, 0.75/mm or less, 0.7/mm or less, 0.6/mm or less, 0.55/mm or less, less than 0.55/mm, 0.54/mm or less, 0.53/mm or less, less than 0.53/mm, 0.52/mm or less, 0.51/mm or less, 0.5/mm or less, 0.48/mm or less, 0.46/mm or less, 0.44/mm or less, or 0.42/mm or less, particularly 0.4/mm or less. Meanwhile, when the β-OH value is too low, meltability is liable to be reduced. Accordingly, a suitable lower limit range of the β-OH value is 0.3/mm or more, particularly 0.35/mm or more.

The adjustment of the β-OH value may be performed by, for example, the use of a hydrous raw material, or the adjustment of a melting method, a melting temperature, or a glass flow rate.

A method of producing the glass fiber of the present invention is described below. In the following description, the method of producing the glass fiber of the present invention is described by taking a direct melting method (DM method) and an indirect forming method (marble melting method: MM method) as examples, but is not limited to the following, and another method may be adopted.

First, a raw material batch is blended so as to achieve the above-mentioned composition. Cullet may be used as part or the whole of glass raw materials.

Next, the raw material batch having been blended is loaded into a glass melting furnace to be vitrified, melted, and homogenized. A melting temperature is suitably from about 1,500° C. to about 1,600° C.

Subsequently, the resultant molten glass is continuously drawn from a bushing to be formed into a fiber form, to thereby provide a glass fiber (DM method). Alternatively, molten glass, which is obtained by forming the resultant molten glass into a marble form once, followed by re-melting, is continuously drawn from a bushing to be formed into a fiber form, to thereby provide a glass fiber (MM method).

A coating agent that imparts desired physicochemical performance may be applied to the surface of the glass fiber as required. Specifically, the glass fiber may be coated with a polyurethane resin, an epoxy resin, an acid copolymer, a modified polypropylene resin, a polyester resin, an antistatic agent, a surfactant, an antioxidant, a coupling agent, or a lubricant.

Examples of the coupling agent that may be used for the surface treatment of the fiber include γ-aminopropyltriethoxysilane, N-phenyl-γ-aminopropyltrimethoxysilane, γ-glycidoxypropyltrimethoxysilane, γ-methacryloxypropyltrimethoxysilane, γ-(2-aminoethyl)aminopropyltrimethoxysilane, β-(3,4-epoxycyclohexyl)ethyltrimethoxysilane, N-β-(N-vinylbenzylaminoethyl)-γ-aminopropyltrimethoxysilane hydrochloride, γ-chloropropyltrimethoxysilane, γ-mercaptopropyltrimethoxysilane, and vinyltriethoxysilane. Those coupling agents may be appropriately selected in accordance with the kind of the resin with which the glass fiber is composited.

The glass fiber of the present invention is suitably used as a chopped strand for reinforcing the resin. Other than the foregoing, the glass fiber of the present invention may be processed into any glass fiber product, such as a yarn, a glass cloth, a glass filler, a glass chopped strand, glass paper, a non-woven fabric, a continuous strand mat, a knitted fabric, a glass roving, or a milled fiber.

The glass fiber of the present invention may be used by being mixed with a fiber other than the fiber of the present invention as long as the object of the present invention is not inhibited. Examples of such fiber include glass fibers, such as an E glass fiber and an S glass fiber, and inorganic fibers other than the glass fibers, such as a carbon fiber and a metal fiber.

Examples

The present invention is described below by way of Examples. However, the present invention is not limited to these Examples.

Examples 1 to 6 of the present invention are shown in Table 1, Examples 7 to 12 of the present invention are shown in Table 2, and Comparative Examples 1 to 3 of the present invention are shown in Table 3.

TABLE 1

| | Unit | Example 1 | Example 2 | Example 3 | Example 4 | Example 5 | Example 6 |
|---|---|---|---|---|---|---|---|
| $SiO_2$ | mass % | 74.7 | 53.3 | 56.9 | 52.4 | 52.7 | 70.8 |
| $Al_2O_3$ | | 0.1 | 16 | 16 | 16 | 17 | 0.02 |
| $B_2O_3$ | | 20 | 22 | 25 | 22 | 21 | 20.3 |
| MgO | | 0.5 | 5 | 0.5 | 5 | 5 | 0.4 |
| CaO | | 0.6 | 3 | 1 | 4.5 | 3.5 | 0.6 |
| SrO | | 0 | 0 | C | 0 | 0 | 0 |
| $Li_2O$ | | 1 | 0.5 | 0 | 0 | 0 | 0 |
| $Na_2O$ | | 1.7 | 0.1 | 0.1 | 0 | 0 | 1.6 |
| $K_2O$ | | 1 | 0 | 0 | 0 | 0.1 | 1.1 |
| $TiO_2$ | | 0.08 | 0 | 0.3 | 0 | 0.6 | 5 |
| $ZrO_2$ | | 0.15 | 0.08 | 0.05 | 0.01 | 0.01 | 0 |
| $SO_3$ | | 0 | 0 | 0.1 | 0.03 | 0 | 0 |
| $Fe_2O_3$ | | 0.02 | 0.05 | 0.012 | 0.06 | 0.06 | 0.01 |
| $SnO_2$ | | 0.2 | 0.01 | 0 | 0 | 0 | 0.2 |
| $MoO_3$ | ppm | 0 | 30 | 50 | 8 | 0.1 | 0 |
| $Cr_2O_3$ | | 0 | 90 | 120 | 80 | 90 | 0 |
| Pt | | 0.02 | 1.2 | 0.3 | 0.05 | 0.3 | 0.02 |
| Rh | | 0.05 | 0 | 4.2 | 0.05 | 4 | 0.3 |
| $MoO_3 + Cr_2O_3 + Pt + Rh$ | ppm | 0.07 | 121.2 | 174.5 | 88.1 | 94.4 | 0.32 |
| $Li_2O + Na_2O + K_2O$ | mass % | 3.7 | 0.6 | 0.1 | 0 | 0.1 | 2.7 |
| $TiO_2$ (mass %) × $MoO_3$ (ppm) | — | 0 | 0 | 15 | 0 | 0.06 | 0 |
| (Pt + Rh)/(Pt + Rh + $MoO_3$ + $Cr_2O_3$) × 100 | % | 100 | 0.99 | 2.58 | 0.11 | 4.56 | 100 |
| Dielectric constant ε | — | 4.3 | 4.9 | 4.8 | 4.6 | 4.8 | 4.4 |
| Dielectric loss tangent tanδ | — | 0.0027 | 0.0105 | 0.0044 | 0.0038 | 0.004 | 0.0031 |
| (% T at 300 nm) * (Pt/(Pt + Rh)) | — | 18.0 | Unmeasured | Unmeasured | 23.0 | 0 | 0 |
| % T at 300 nm | % | 63 | Unmeasured | Unmeasured | 46 | 0 | 0 |
| min % T 400-800 nm | % | 90 | Unmeasured | Unmeasured | 88 | 71 | 51 |
| $10^4$ | ° C. | 1,096 | 1,140 | 1,131 | 1,174 | 1,125 | 1,158 |
| $10^3$ (spinning temperature) | | 1,325 | 1,302 | 1,285 | 1,335 | 1,245 | 1,403 |
| $10^{2.5}$ | | 1,410 | 1,383 | 1,380 | 1,435 | 1,335 | 1,568 |
| $10^2$ | | 1,530 | 1,500 | 1,500 | 1,564 | 1,450 | 1,776 |
| Liquidus temperature $T_L$ | | 912 | 1,125 | 880 | 1,100 | 1,135 | 1,086 |
| ΔT (spinning temperature-liquidus temperature) | | 413 | 177 | 405 | 235 | 110 | 317 |
| Density ρ | g/cm³ | 2.19 | 2.32 | 2.32 | 2.317 | 2.35 | 2.222 |
| Young's modulus | GPa | 62 | 69 | 63 | Unmeasured | 64 | 57 |
| β-OH | /mm | 0.41 | 0.53 | 0.6 | 0.5 | 0.8 | 0.56 |

TABLE 2

| | Unit | Example 7 | Example 8 | Example 9 | Example 10 | Example 11 | Example 12 |
|---|---|---|---|---|---|---|---|
| $SiO_2$ | mass % | 75.3 | 51.7 | 76.4 | 73.6 | 73.5 | 75.0 |
| $Al_2O_3$ | | 0.02 | 15.5 | 0.06 | 0.05 | 0.05 | 0.1 |
| $B_2O_3$ | | 19.6 | 20 | 18.8 | 22.3 | 22.6 | 20 |
| MgO | | 0.4 | 6 | 0.3 | 0.3 | 0.3 | 0.4 |
| CaO | | 0.6 | 4 | 0.6 | 0.6 | 0.6 | 0.6 |
| SrO | | 0 | 0 | 0 | 0 | 0 | 0 |
| $Li_2O$ | | 0.9 | 0.3 | 0.9 | 0.8 | 0 | 0.9 |
| $Na_2O$ | | 1.6 | 0.1 | 1.7 | 1.4 | 0.13 | 1.6 |
| $K_2O$ | | 1.1 | 0 | 1.2 | 0.9 | 2.8 | 1.1 |
| $TiO_2$ | | 0.08 | 2.21 | 0.02 | 0.015 | 0.015 | 0.1 |
| $ZrO_2$ | | 0.15 | 0.03 | 0.002 | 0.002 | 0.002 | 0.14 |
| $SO_3$ | | 0.002 | 0 | 0.006 | 0.006 | 0.006 | 0.006 |
| $Fe_2O_3$ | | 0.033 | 0.1 | 0.006 | 0.005 | 0.005 | 0.033 |
| $SnO_2$ | | 0.2 | 0.02 | 0 | 0 | 0 | 0 |
| $MoO_3$ | ppm | 450 | 100 | 0.1 | 1 | 3 | 3 |
| $Cr_2O_3$ | | 0 | 30 | 80 | 100 | 90 | 90 |
| Pt | | 0.02 | 0.2 | 0.5 | 0.4 | 0.6 | 0.5 |
| Rh | | 0.03 | 0.03 | 3.8 | 4 | 3.5 | 4.2 |
| $MoO_3 + Cr_2O_3 + Pt + Rh$ | ppm | 450.05 | 130.23 | 84.40 | 105.40 | 97.10 | 97.70 |

TABLE 2-continued

| | Unit | Example 7 | Example 8 | Example 9 | Example 10 | Example 11 | Example 12 |
|---|---|---|---|---|---|---|---|
| $Li_2O + Na_2O + K_2O$ | mass % | 3.6 | 0.4 | 3.8 | 3.1 | 2.93 | 3.6 |
| $TiO_2$ (mass %) × $MoO_3$ (ppm) | — | 36 | 221 | 0.002 | 0.015 | 0.045 | 0.3 |
| (Pt + Rh)/(Pt + Rh + $MoO_3$ + $Cr_2O_3$) × 100 | % | 0.01 | 0.18 | 5.09 | 4.17 | 4.22 | 4.81 |
| Dielectric constant ε | — | 4.2 | 4.8 | 4.2 | 4.2 | 4.2 | 4.3 |
| Dielectric loss tangent tanδ | — | 0.0036 | 0.0046 | 0.0041 | 0.0048 | 0.0033 | 0.0027 |
| (% T at 300 nm) * (Pt/(Pt + Rh)) | — | 22.0 | 1.7 | 7.0 | 5.7 | 8.9 | 6.7 |
| % T at 300 nm | % | 55 | 2 | 60 | 63 | 61 | 63 |
| min % T 400-800 nm | % | 91 | 87 | 90 | 89 | 89 | 90 |
| $10^4$ | ° C. | 1,091 | 1,132 | 1,096 | 1,061 | 1,137 | 1,090 |
| $10^3$ (spinning temperature) | | 1,315 | 1,284 | 1,326 | 1,278 | 1,372 | 1,317 |
| $10^{2.5}$ | | 1,478 | 1,450 | 1,406 | 1,428 | 1,536 | 1,478 |
| $10^2$ | | 1,705 | 1,680 | 1,530 | 1,620 | 1,720 | 1,659 |
| Liquidus temperature $T_L$ | | 96. | 1,070 | 912 | 849 | Unmeasured | 925 |
| ΔT (spinning temperature-liquidus temperature) | | 351 | 214 | 414 | 429 | Unmeasured | 392 |
| Density ρ | g/cm³ | 2.207 | 2.352 | 2.199 | 2.176 | 2.153 | 2.205 |
| Young's modulus | GPa | 62 | 69 | 62 | 58 | Unmeasured | 62 |
| β-OH | /mm | 0.58 | 0.48 | 0.59 | 0.58 | 0.60 | 0.50 |

TABLE 3

| | Unit | Comparative Example 1 | Comparative Example 2 | Comparative Example 3 |
|---|---|---|---|---|
| $SiO_2$ | mass % | 55.7 | 69 | 75.45 |
| $Al_2O_3$ | | 13 | 0.02 | 0.09 |
| $B_2O_3$ | | 5 | 20.7 | 20 |
| MgO | | 2 | 0.4 | 0.4 |
| CaO | | 23 | 0.6 | 0.6 |
| SrO | | 0.06 | 0 | 0 |
| $Li_2O$ | | 0 | 0 | 0.7 |
| $Na_2O$ | | 0.6 | 1.7 | 1.6 |
| $K_2O$ | | 0.1 | 1.1 | 0.9 |
| $TiO_2$ | | 0.3 | 6.3 | 0.08 |
| $ZrO_2$ | | 0.02 | 0.01 | 0.15 |
| $SO_3$ | | 0 | 0 | 0.002 |
| $Fe_2O_3$ | | 0.2 | 0 | 0.033 |
| $SnO_2$ | | 0.02 | 0.2 | 0 |
| $MoO_3$ | ppm | 0 | 500 | 0 |
| $Cr_2O_3$ | | 50 | 0 | 0 |
| Pt | | 0.06 | 0 | 0 |
| Rh | | 0.02 | 0 | 0 |
| $MoO_3$ + $Cr_2O_3$ + Pt + Rh | ppm | 50.08 | 500 | 0 |
| $Li_2O$ + $Na_2O$ + $K_2O$ | mass % | 0.7 | 2.8 | 3.2 |
| $TiO_2$ (mass %) × $MoO_3$ (ppm) | — | 0 | 3,150 | 0 |
| (Pt + Rh)/(Pt + Rh + $MoO_3$ + $Cr_2O_3$) × 100 | % | 0.16 | 0 | — |
| Dielectric constant ε | — | 6.6 | 4.4 | 4.1 |
| Dielectric loss tangent tanδ | — | 0.0081 | 0.003 | 0.0034 |
| (% T at 300 nm)*(Pt/(Pt + Rh)) | — | 12.0 | — | — |
| % T at 300 nm | % | 16 | 0 | 72 |
| min % T 400-800 nm | % | 89 | 9 | 91 |
| $10^4$ | ° C. | 1,068 | 1,185 | 1,100 |
| $10^3$ (spinning temperature) | | 1,185 | 1,455 | 1,320 |
| $10^{2.5}$ | | 1,256 | 1,610 | 1,403 |
| $10^2$ | | 1,352 | 1,768 | 1,525 |
| Liquidus temperature $T_L$ | | 1,075 | 1,154 | 908 |
| ΔT (spinning temperature-liquidus temperature) | | 110 | 301 | 412 |
| Density ρ | g/cm³ | 2.66 | 2.235 | 2.19 |
| Young's modulus | GPa | 89 | 57 | 61 |
| β-OH | /mm | 0.59 | 0.56 | 0.56 |

The samples shown in Tables 1 to 3 were each produced as described below.

First, various glass raw materials, such as a natural raw material and a chemical raw material, were weighed by 500 g in total and prepared so that a glass composition obtained after melting became the glass composition shown in each of Tables 1 to 3. Next, the resultant raw material batch was ground and mixed for 20 minutes. Next, the raw material batch having been ground was loaded into a 300 cc platinum-rhodium crucible, and was then heated at from about 1,450 to about 1,650° C. for 6 hours in an air atmosphere in an indirect-heating electric furnace to provide molten glass. The resultant molten glass was poured out onto a carbon sheet, subjected to roll forming so as to achieve a thickness of 5 mm, and left to cool to room temperature.

In each of Example 7 in Table 2 and Comparative Example 3 in Table 3, the materials were melted by the following procedure to provide a sample for evaluation. Various glass raw materials, such as a natural raw material and a chemical raw material, were weighed by 300 g in total and prepared so that a glass composition obtained after melting became the glass composition shown in each of Tables 2 and 3. In Example 7, 0.135 g of MoO$_3$ was added to the resultant raw material batch. The raw material batch having added thereto MoO$_3$ was ground and mixed for 20 minutes. In Comparative Example 3, MoO$_3$ was not added. Next, the raw material batch having been ground was loaded into a 300 cc quartz glass crucible, and was then heated at from about 1,450 to about 1,650° C. for 6 hours in an air atmosphere in an indirect-heating electric furnace to provide molten glass. The resultant molten glass was poured out onto a carbon sheet, subjected to roll forming so as to achieve a thickness of 5 mm, and left to cool to room temperature.

The resultant samples were each measured for the following characteristics.

A dielectric constant ε and a dielectric loss tangent tan δ at a frequency of 40 GHz were measured as described below. A glass sample obtained by the above-mentioned method was processed into dimensions of 30 mm×40 mm×0.15 mmt. Both the main surfaces thereof were polished to be mirror finished. The resultant sample was subjected to annealing treatment. The measurement was performed by a split cylinder method with a resonator for 40 GHz and a vector analyzer. In addition, the measurement was performed at room temperature (25° C.).

The annealing treatment was performed by the following temperature schedule with an annealer. The sample was placed in the annealer, and was increased in temperature from room temperature to from 580° C. to 600° C. at 1° C./min, retained at from 580° C. to 600° C. for 30 minutes, and then cooled to from 400° C. to 420° C. at 3° C./min, and after that, was left to cool to room temperature in the annealer.

A transmittance was measured as described below. A glass sample obtained by the above-mentioned method was processed into dimensions of 25 mm×30 mm×1 mmt. Both the main surfaces thereof were polished to be mirror finished. The resultant sample was subjected to annealing treatment under the above-mentioned conditions. The measurement was performed with a spectrophotometer V-670 (manufactured by JASCO Corporation). A measurement wavelength, a scanning speed, and a sampling pitch were set to from 200 nm to 800 nm, 200 nm/min, and 1 nm, respectively, and the measurement was performed at room temperature. In each of the tables, "% T at 300 nm" means a total light transmittance at a wavelength of 300 nm, and "min % T 400-800 nm" means a minimum total light transmittance at wavelengths of from 400 nm to 800 nm.

A temperature at a viscosity at high temperature of $10^4$ dPa·s, a temperature at a viscosity at high temperature of $10^3$ dPa·s, a temperature at a viscosity at high temperature of $10^{2.5}$ dPa·s, and a temperature at a viscosity at high temperature of $10^2$ dPa·s (represented as "$10^4$", "$10^3$", "$10^{2.5}$", and "$10^2$", respectively in each of the tables) were each measured as follows: part of a glass sample obtained by the above-mentioned method was crushed in advance so as to achieve a proper size; the resultant was loaded into a platinum crucible to be reheated to a molten state; and then the measurement was performed by a platinum sphere pull up method.

A liquidus temperature $T_L$ was measured as described below. A glass sample obtained by the above-mentioned method was pulverized, and powder that had passed through a sieve having an opening of 500 μm and deposited on a sieve having an opening of 300 μm was collected by a weight corresponding to 10 times of its density. The glass powder having been collected was loaded into a platinum boat having internal dimensions of about 120 mm×about 20 mm×about 10 mm, and the platinum boat was loaded into an electric furnace having a linear temperature gradient for 24 hours. After that, the glass was taken out of the platinum boat and cooled to room temperature, and was then specified for a crystal precipitation site through observation with a microscope. A temperature corresponding to the crystal precipitation site was calculated from a temperature gradient graph of the electric furnace, and the resultant temperature was used as a liquidus temperature.

A density ρ was measured as follows: a glass sample obtained by the above-mentioned method was cut out by about 10 g; and the density was measured by an Archimedes method. Before the measurement, annealing treatment was performed by the above-mentioned method.

A Young's modulus was measured as described below. A glass sample obtained by the above-mentioned method was processed into 40 mm×20 mm×2 mm. Both the main surfaces of the resultant sample were polished with a polishing liquid obtained by mixing #1200 alumina powder with water. Before the measurement, the sample was subjected to the above-mentioned annealing treatment so that strain was removed therefrom. Further, gold was deposited by vapor deposition on the surface of the sample so as to achieve a thickness of 1,500 Å or more. The measurement was performed with a free resonance elastic modulus measurement device (JE-RT3 manufactured by Nihon Techno-Plus Co. Ltd.).

A β-OH value was measured by the following procedure. A glass sample obtained by the above-mentioned method was processed into 20 mm×30 mm×1 mm. Both the main surfaces of the resultant sample were mirror polished and finished. Before the measurement, the sample was subjected to the above-mentioned annealing treatment so that strain was removed therefrom. The β-OH value was measured by the above-mentioned method through use of the sample.

The above-mentioned characteristics may also be measured as follows: a bulk-form glass sample is produced by the following procedure from a glass fiber sample or a glass bead sample having been produced; and the characteristics are measured through use of the bulk-form glass sample. The glass fiber sample or the glass bead sample is loaded into a quartz vessel, and is melted in an electric furnace set to a temperature corresponding to a viscosity at high temperature of $10^3$ dPa·s. A melting time period depends on the weight of the glass, but is preferably from about 15 minutes to about 5 hours. When the sample is added to molten glass, the quartz vessel may be broken through thermal shock, and hence the loading of the sample is preferably performed at once without being divided into a plurality of times. In the case of the glass fiber sample, as required, in order to remove a sizing agent applied to its surface, it is preferred that the sample be subjected to heat treatment at from 400° C. to 500° C. for from 6 hours to 12 hours in a quartz vessel, and be then loaded into the quartz vessel.

After it is recognized that bubbles in the molten glass have disappeared, the sample is taken out of the electric furnace, poured out onto a carbon sheet, and subjected to roll forming so as to achieve a thickness of 5 mm. The resultant glass sheet is left to cool to room temperature. When the amount of the glass is so small that the roll forming cannot be performed, the molten glass having been poured out may also be cooled by being pressed with an iron sheet. When it is required to remove strain at the time of measurement, annealing is performed by the above-mentioned method. When the amount of the glass is so small that the glass cannot be poured out, annealing is performed by leaving the glass to stand still in an annealer with the quartz vessel.

As shown in Tables 1 and 2, the glass of each of Examples 1 to 12 had a dielectric constant and a dielectric loss tangent at 40 GHz as low as 4.9 or less and 0.0105 or less, respectively. In addition, the glass of each of Examples 1 to 12 has a total light transmittance at 300 nm as low as 63% or less, and hence it is found that the glass easily absorbs UV light. Further, the glass of each of Examples 1 to 12 has a minimum total light transmittance at from 400 nm to 800 nm of 51% or more, and hence it is found that the glass is less colored and thus hardly changes the color tone of a composite material.

Meanwhile, as shown in Table 3, the glass of Comparative Example 1 had a small content of $B_2O_3$ and had a dielectric constant as high as 6.6. The glass of Comparative Example 2 had a value of $TiO_2 \times MoO_3$ as high as 3,150, and was hence strongly colored and had a minimum total light transmittance at wavelengths of from 400 nm to 800 nm of 9% or less. The glass of Comparative Example 3 did not contain any of $MoO_3$, $Cr_2O_3$, Pt, and Rh, and hence had a transmittance at a wavelength of 300 nm as high as 72%.

INDUSTRIAL APPLICABILITY

The glass fiber of the present invention can be suitably used, as a fiber-reinforced resin molded article, as a casing or a member of a portable electronic device, such as a smartphone, a tablet, a laptop computer, a portable music player, or a portable game console, or as well, as a communication member to be used in a millimeter wave band, such as an automobile millimeter-wave radar, a vehicle exterior member, a vehicle interior member, a vehicle engine peripheral member, an electronic device casing, or an electronic component.

The invention claimed is:

1. A glass fiber, comprising as a glass composition, in terms of mass %, 55% to 80% of $SiO_2$, 0% to 15% of $Al_2O_3$, 18% to 24% of $B_2O_3$, 0% to 4% of MgO, 0% to 5% of CaO, 0% to 1% of SrO, 0% to 2% of $Li_2O$, 0% to 3% of $Na_2O$, 0% to 3% of $K_2O$, 1% to 3.8% of $Li_2O+Na_2O+K_2O$, 0% to 0.2% of $ZrO_2$, 0 to 0.5% of $Fe_2O_3$, 0% to 0.5% of $SnO_2$, 0.01% to 6% of $TiO_2$, and 0.01 ppm to 500 ppm of $MoO_3$,
having a total content of $MoO_3$, $Cr_2O_3$, Pt, and Rh of from 0.01 ppm to 500 ppm,
having a value of $TiO_2$ (mass %)×$MoO_3$ (ppm) of 3,000 or less, and
having a β-OH value of less than 0.55/mm.

2. The glass fiber according to claim 1, wherein the glass fiber has a total light transmittance at a wavelength of 300 nm of 70% or less and a minimum total light transmittance at wavelengths of from 400 nm to 800 nm of 50% or more at a thickness of 1 mm.

3. The glass fiber according to claim 1, wherein the glass fiber has a dielectric constant of 6 or less and a dielectric loss tangent of 0.011 or less at 25° C. and 40 GHz.

4. The glass fiber according to claim 1, wherein the glass fiber has a spinning temperature of 1,450° C. or less.

5. The glass fiber according to claim 1, wherein the glass fiber comprises as a glass composition, in terms of mass %, 0 to 0.15% of $Fe_2O_3$, 0.01 ppm to 100 ppm of Pt.

* * * * *